US009588312B2

(12) United States Patent
Chang et al.

(10) Patent No.: US 9,588,312 B2
(45) Date of Patent: Mar. 7, 2017

(54) OPTICAL MODULE ASSEMBLY WITH IMPROVED PRINTED CIRCUIT BOARD

(71) Applicant: FOXCONN INTERCONNECT TECHNOLOGY LIMITED, Grand Cayman (KY)

(72) Inventors: Chun-Yi Chang, New Taipei (TW); Jia-Hau Liu, New Taipei (TW)

(73) Assignee: FOXCONN INTERCONNECT TECHNOLOGY LIMITED, Grand Cayman (KY)

( * ) Notice: Subject to any disclaimer, the term of this patent is extended or adjusted under 35 U.S.C. 154(b) by 0 days.

(21) Appl. No.: 14/884,772

(22) Filed: Oct. 16, 2015

(65) Prior Publication Data

US 2016/0109664 A1 Apr. 21, 2016

(30) Foreign Application Priority Data

Oct. 16, 2014 (TW) ............................ 103135778 A

(51) Int. Cl.
*G02B 6/42* (2006.01)
*H05K 1/02* (2006.01)

(52) U.S. Cl.
CPC .......... *G02B 6/428* (2013.01); *G02B 6/4206* (2013.01); *H05K 1/0209* (2013.01); *H05K 1/0243* (2013.01); *H05K 2201/09063* (2013.01); *H05K 2201/10121* (2013.01); *H05K 2201/10545* (2013.01); *H05K 2203/167* (2013.01)

(58) Field of Classification Search
None
See application file for complete search history.

(56) References Cited

U.S. PATENT DOCUMENTS 6,483,960 B2 * 11/2002 Schroedinger ....... G02B 6/4206 257/80
6,910,812 B2 * 6/2005 Pommer ............. G02B 6/4201 257/200
7,063,467 B2 * 6/2006 Nagasaka ........... G02B 6/4214 385/88
7,108,432 B2 * 9/2006 Nagasaka ............... G02B 6/32 385/129
7,239,767 B2 * 7/2007 Kim ........................ G02B 6/42 385/14
7,373,033 B2 * 5/2008 Lu .......................... G02B 6/421 257/432

(Continued)

FOREIGN PATENT DOCUMENTS

CN 103201661 A 7/2013
CN 103389550 A 11/2013

(Continued)

*Primary Examiner* — Mike Stahl
(74) *Attorney, Agent, or Firm* — Wei Te Chung; Ming Chieh Chang

(57) ABSTRACT

An optoelectronic assembly includes a printed circuit board (PCB) defining opposite upper and lower surfaces, and equipped, on the upper surface, with an active component and an Integrated Circuit (IC) linked to each other via the flip chip technology, a lens module located on the side of the lower surface and communicating with the active component through via holes in the PCB, and a fiber assembly located in the lens module to be optically coupled to the active component via said lens module.

15 Claims, 7 Drawing Sheets

13
132
17
17
12
122
17
115
11
116
117
118
14
145
16
146
200

(56) References Cited

U.S. PATENT DOCUMENTS 8,536,610 B2 * 9/2013 Doany ................. G02B 6/4246 257/79
8,636,426 B2 1/2014 Lin et al.
8,842,952 B2 * 9/2014 Tanaka ..................... G02B 6/42 385/14
2004/0202477 A1 * 10/2004 Nagasaka ............ G02B 6/4292 398/138
2005/0087747 A1 * 4/2005 Yamada ................... G02B 6/43 257/80
2005/0169639 A1 * 8/2005 Shen .................... G02B 6/4212 398/164
2005/0180679 A1 * 8/2005 Shimizu .............. H01S 5/02272 385/14
2010/0284647 A1 * 11/2010 Stevenson ............ G02B 6/4249 385/14
2011/0044367 A1 * 2/2011 Budd ................... G02B 6/4201 372/50.21
2011/0108716 A1 * 5/2011 Shiraishi .............. G02B 6/4249 250/227.24
2013/0266264 A1 10/2013 Tomita
2014/0177998 A1 * 6/2014 Tseng ................... G02B 6/4206 385/14
2014/0233961 A1 * 8/2014 Wu ........................ H04B 10/40 398/135
2014/0321816 A1 * 10/2014 Wu ........................ G02B 6/428 385/88
2015/0098675 A1 * 4/2015 Ishiyama ............. G02B 6/4214 385/14
2016/0109665 A1 * 4/2016 Chang .................... G02B 6/428 385/14

FOREIGN PATENT DOCUMENTS

CN 103777286 A 5/2014
JP 5184708 B1 4/2013
TW 201327874 A 7/2013

* cited by examiner 12
15
144
17
16
11
146
15
12
200
17
16
13
14
17

OPTICAL MODULE ASSEMBLY WITH IMPROVED PRINTED CIRCUIT BOARD

BACKGROUND OF THE INVENTION

1. Field of the Invention

The present invention relates to an optoelectronic assembly, and particularly to the optoelectronic assembly with superior heat dissipation. The invention relates to the copending application titled "OPTICAL MODULE WITH GLASS SLIDE" having the same filing date and the same inventors and the same applicant with the instant application.

2. Description of Related Art

The traditional optoelectronic assembly includes a printed circuit board (PCB) equipped with the active component, e.g., the vertical-cavity surface-emitting laser (VCSEL) or PIN (p-doped-intrinsic-n-doped) photodetectors, and integrated circuit (IC) linked by the wire-bond. Firstly, the wire-bond is slender with high resistance thereof, thus resulting in high inductance which is not fit for high frequency transmission. Secondly, via such wire-bonds, it is required to have both the active component and IC face up so as to have the heat-dissipation surfaces of both the component and the IC directly seated upon the printed circuit board, thus jeopardizing the efficiencies of the heat dissipation thereof. Thirdly, because the active component and IC face up, the corresponding lens is required to be seated upon/above the active component, thus hindering inspection of the interior size, current and voltage of the active component and the corresponding repairing and adjustment if the VCSEL becomes defective.

Hence, an improved optoelectronic assembly is desired to overcome the foregoing drawbacks.

BRIEF SUMMARY OF THE INVENTION

Accordingly, an object of the present invention is to provide an improved optoelectronic assembly which is adapted to be used in high frequency transmission and be repaired/adjusted.

In order to achieve the above-mentioned object, an optoelectronic assembly includes a printed circuit board (PCB) defining opposite upper and lower surfaces, and equipped, on the upper surface, with an active component and an Integrated Circuit (IC) linked to each other via the flip chip technology, a lens module located on the side of the lower surface and communicating with the active component through via holes in the PCB, and a fiber assembly located in the lens module to be optically coupled to the active component via said lens module.

Other objects, advantages and novel features of the invention will become more apparent from the following detailed description of the present embodiment when taken in conjunction with the accompanying drawings.

DETAILED DESCRIPTION OF THE PREFERRED EMBODIMENT

Figure 1:
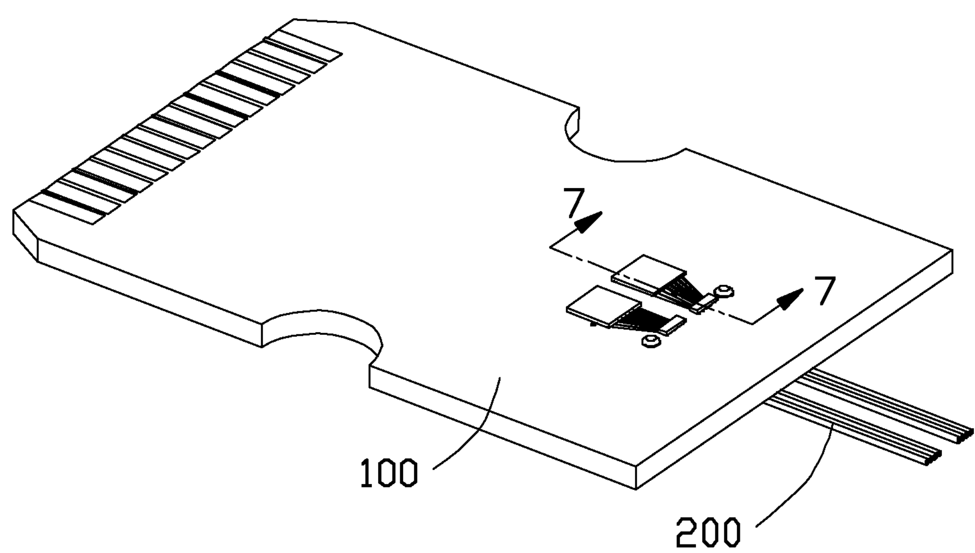
FIG. 1 is a perspective view of an optoelectronic assembly of a presently preferred embodiment of the invention.
Figure 2:
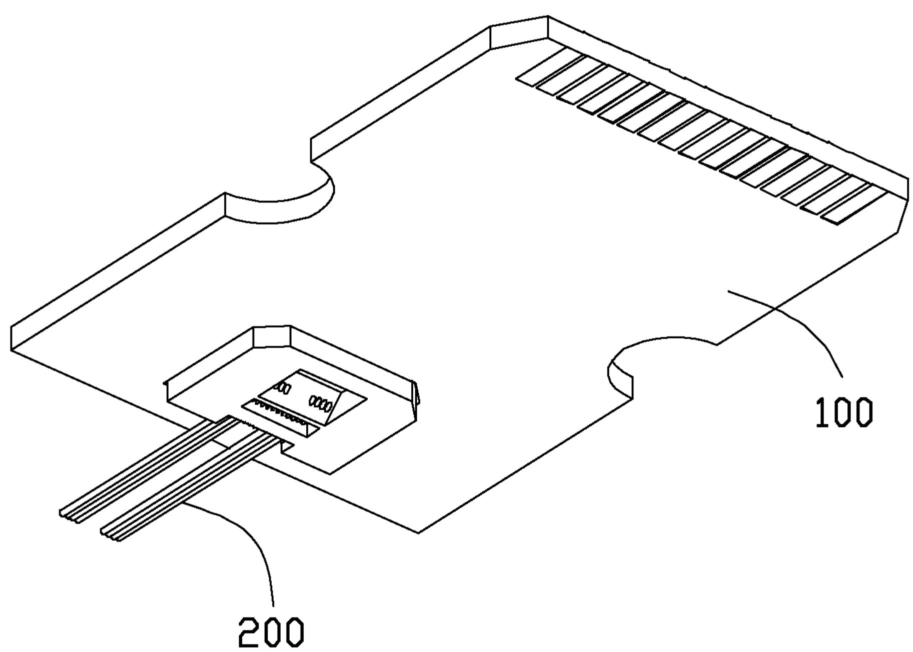
FIG. 2 is another perspective view of the optoelectronic assembly of FIG. 1.
Figure 3:
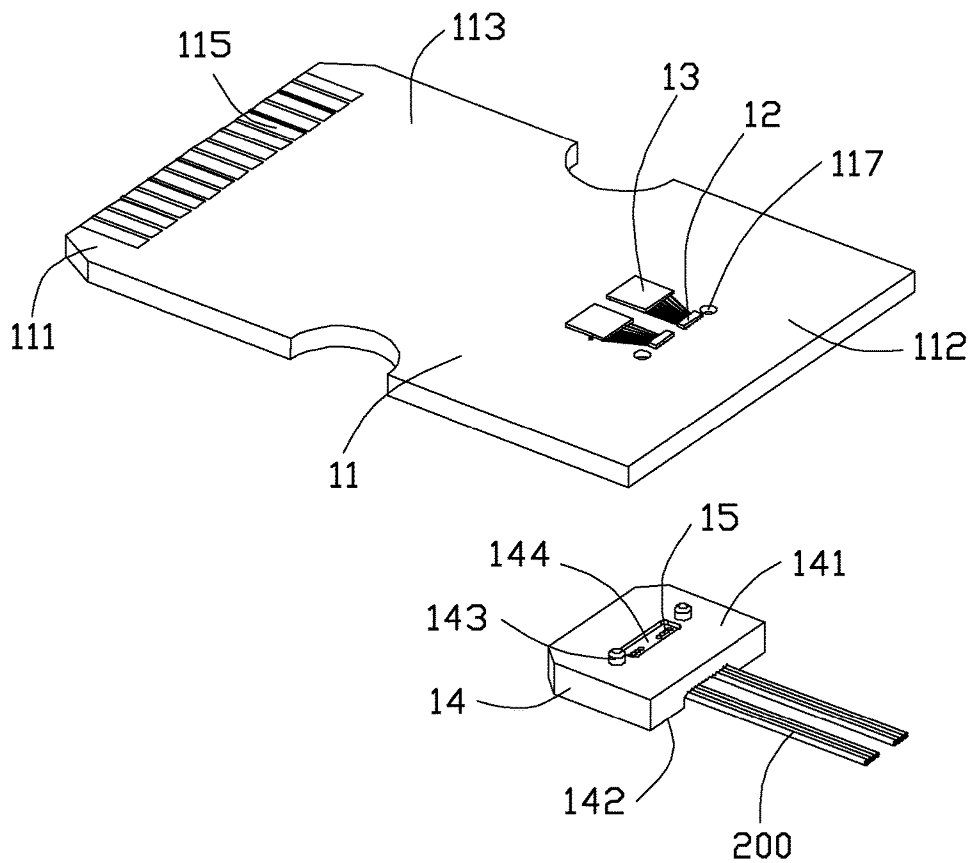
FIG. 3 is an exploded perspective view of the optoelectronic assembly of FIG. 1.
Figure 4:
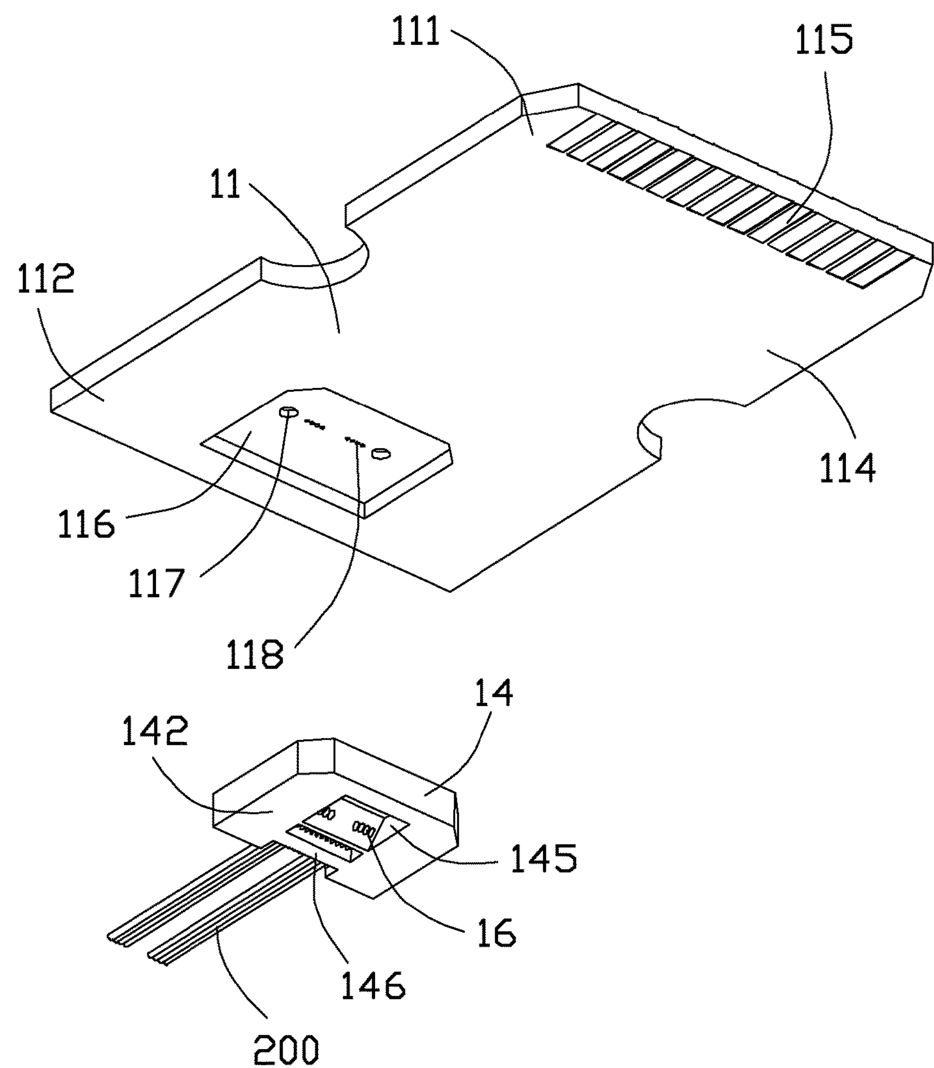
FIG. 4 is another exploded perspective of the optoelectronic assembly of FIG. 1.
Figure 5:
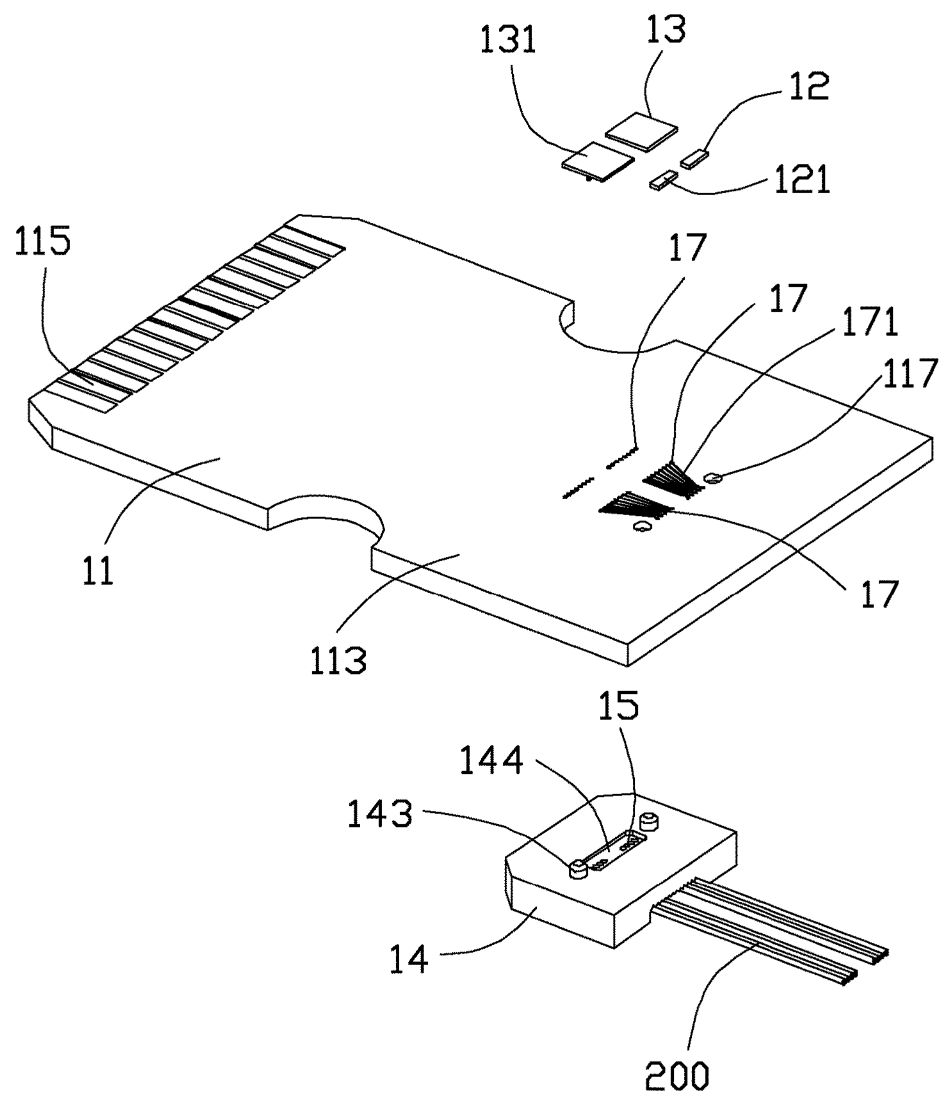
FIG. 5 is a further exploded perspective view of the optoelectronic assembly of FIG. 3.
Figure 6:
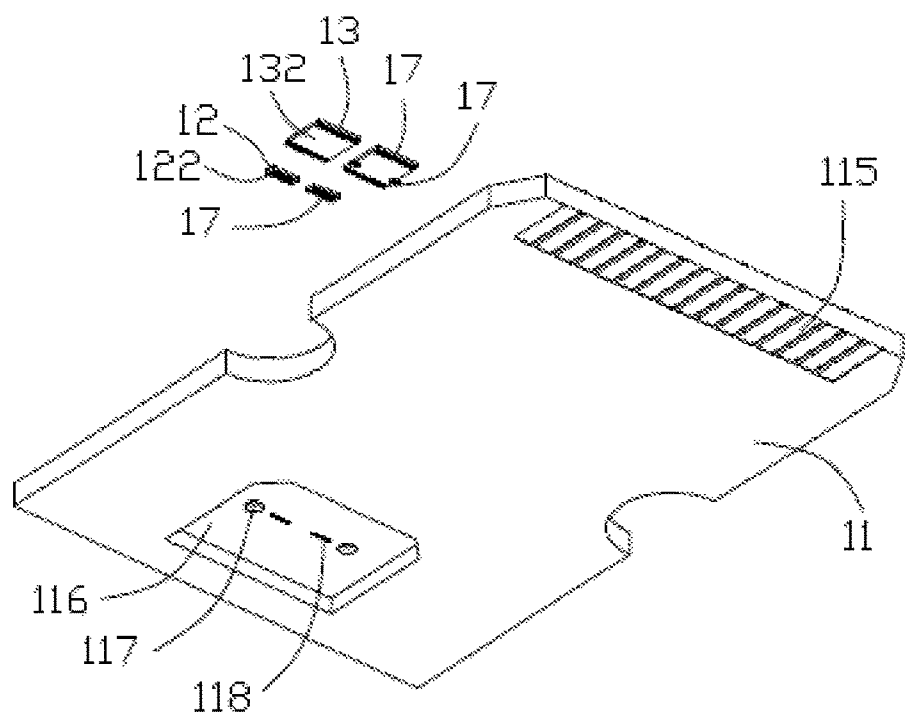
FIG. 6 is another further exploded perspective view of the optoelectronic assembly of FIG. 4.
Figure 6:
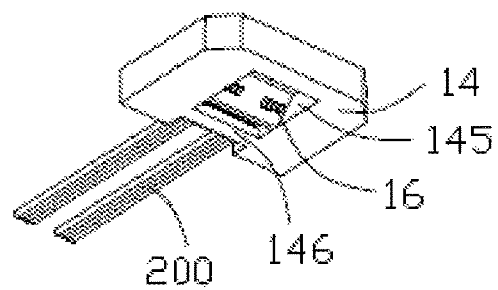
Figure 7:
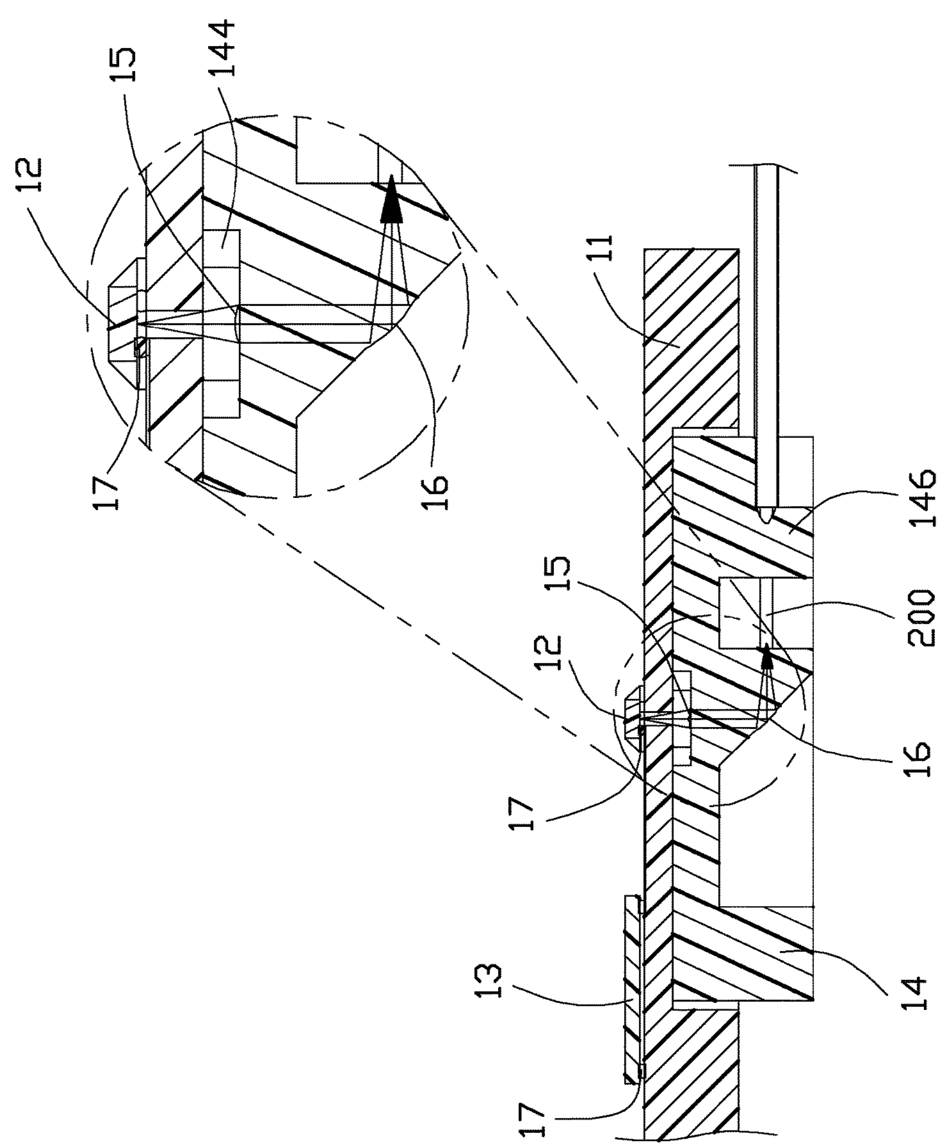
FIG. 7 is a cross-sectional view of the optoelectronic assembly of FIG. 1.

Referring to FIGS. 1 through 7, an optoelectronic assembly 100 includes a printed circuit board 11 (PCB), two active components 12 and two Integrated Circuit (IC) 13 mounted upon an upper side or upper surface of the PCB 11, and a lens module 14 mounted upon the lower side or lower surface of the PCB 11 associated with optical fibers 200.

The PCB 11 includes opposite first end region or electrical connection region 111 for mating with a complementary electrical connector (not shown) and second end or optical connection region 112 for loading the lens module 14. The PCB 11 further defines opposite upper surface 113 and lower surface 114 wherein around the first end region 111 both the upper surface 113 and the lower surface 114 are equipped with conductive pads 115 for mating with the aforementioned complementary connector. Both the active components 12 and the ICs 13 are mounted upon the upper surface 113. A receiving cavity 116 is formed in the lower surface 114 in which the lens module 14 is received. A pair of alignment holes 117 and a plurality of via holes 118 therebetween are formed in the second end region 112.

The active component 12 and the IC 13 form the corresponding opposite upper surfaces 121, 131 and lower surfaces 122, 132 wherein the first surfaces 121, 131 are the so-called heat dissipation surfaces. The active component 12 and the IC are mounted upon the upper surface 113 of the PCB 11 via the solder balls 17 on the lower surfaces 122, 132. The active component 12 and the corresponding IC 13 are electrically connected to each other by the conductive traces 171 printed on the upper surfaces 113 of the PCB 11.

The lens module 14 is formed by the transparent body unitarily with the first lenses 15 and the second lenses 16 thereon. The lens module 14 includes an upper surface 141 and the lower surface 142, a pair of alignment posts 143 to be respectively received in the corresponding alignment holes 117 and a shallow region 144 therebetween. The first lenses 15 are formed in the shallow region 144 and respectively aligned with the corresponding via holes 118 in the vertical direction, and thus also aligned with the active component 12 in the vertical direction. Understandably, the via holes 118 are used for passage of the optical signal or light. A recess 145 is formed in the lower surface 142 so as to form the second lenses 16 therein. A transverse bar 146 is formed on the lens module 14 with a plurality of grooves (not labeled) therein to receive the corresponding optical fibers 200, respectively. During operation, the light or optical signal from the fiber 200 hits the second lens 16 and is reflected to the first lens 15 and finally reaches the active component 12 by way of the corresponding via hole 118 and is then converted to the electrical signal and transmitted to the IC 13 and finally reaches the conductive pads 115 on the first end region 111. Understandably, the reverse operation is feasible if the active component 12 is the VCSEL rather than the photodetector.

Understandably, compared with the traditional wire-bond way between the IC and the active component, the invention may lower the inductance, enhance heat dissipation, and make it convenient to inspect the electrical characters on the IC and the active component, respectively. The via holes 118 are required to be formed by way of die-bond with the fine precision.

It is to be understood, however, that even though numerous, characteristics and advantages of the present invention have been set fourth in the foregoing description, together with details of the structure and function of the invention, the disclosed is illustrative only, and changes may be made in detail, especially in matters of number, shape, size, and arrangement of parts within the principles of the invention to the full extent indicated by the broad general meaning of the terms in which the appended claims are expressed.

What is claimed is:

1. An optoelectronic assembly comprising:

a printed circuit board (PCB) defining vertically opposite first and second sides thereof in a vertical direction;

an active component for optoelectronic conversion mounted upon the first side with a heat dissipation surface exposed to an exterior;

an integrated circuit (IC) mounted upon the first side and electrically connected to the active component via conductive traces; wherein the optoelectronic assembly includes a lens module mounted on said second surface and communicatively coupling to the active component by way of via holes in the PCB; wherein a receiving cavity is formed in the second side of the PCB to receive said lens module therein in the vertical direction.

2. The optoelectronic assembly as claimed in claim 1, wherein the lens module unitarily forms first lenses and second lenses aligned with the corresponding via holes in the vertical direction, respectively.

3. The optoelectronic assembly as claimed in claim 2, wherein the first lenses are formed in a shallow region in an upper surface of the lens module, and the second lenses are formed in a recess in a lower surface of the lens module.

4. The optoelectronic assembly as claimed in claim 2, wherein said lens module further forms a plurality of horizontally extending grooves to receive a plurality of optical fibers therein.

5. The optoelectronic assembly as claimed in claim 1, wherein said PCB forms a pair of alignment holes, and the lens module forms a pair of alignment posts extending through said pair of alignment holes, respectively.

6. The optoelectronic assembly as claimed in claim 1, wherein said via holes are arranged along a transverse direction perpendicular to said vertical direction, and the PCB forms two opposite first and second end regions along a longitudinal direction perpendicular to both said vertical direction and said transverse direction, and the PCB forms conductive pads on the first end region and the lens module is located on the second end region.

7. The optoelectronic assembly as claimed in claim 6, wherein the active component and the IC are arranged to be spaced from each other in said longitudinal direction, and the active component is closer to the second end region than the IC to the second end region.

8. An optoelectronic assembly comprising:

a printed circuit board (PCB) defining an optical connection region and an electrical connection region opposite to each other along a longitudinal direction;

an active component for optoelectronic conversion and an integrated circuit (IC) commonly mounted upon the optical connection region; wherein the active component and the IC are electrically connected via conductive traces via a flip chip technology; wherein the PCB forms opposite first and second surfaces in a vertical direction perpendicular to said longitudinal direction, and said active component mounted upon the first surface while a lens module mounted upon the second surface; wherein the PCB forms a pair of alignment holes, and the lens module includes a pair of alignment posts received in the pair of corresponding alignment holes, respectively, in said vertical direction; wherein the PCB forms a plurality of via holes extending through both said first and second surfaces in the vertical direction to communicate said active component and said lens module.

9. The optoelectronic assembly as claimed in claim 8, wherein said lens module includes first lenses and second lenses respectively aligned with each other and further aligned with the corresponding via holes.

10. The optoelectronic assembly as claimed in claim 9, wherein said lens module is equipped with a plurality of horizontal grooves horizontally aligned with the corresponding second lenses, respectively, and a plurality of optical fibers are received in the corresponding grooves, respectively, to be coupled to the corresponding second lenses.

11. The optoelectronic assembly as claimed in claim 8, wherein said PCB forms a receiving cavity to receive said lens module therein.

12. An optoelectronic assembly comprising:

a printed circuit board (PCB) defining opposite first and second surfaces in a vertical direction;

an active component for optoelectronic conversion mounted upon the first surface with a heat dissipation surface opposite to the PCB and exposed to an exterior; and a lens module mounted upon the second surface with lenses communicatively aligned with the active component in the vertical direction by way of corresponding via holes formed in the PCB; wherein the PCB forms a pair of alignment holes, and the lens module includes a pair of alignment posts received in the pair of corresponding alignment holes, respectively, in said vertical direction; wherein the optoelectronic assembly further includes an integrated circuit (IC) electrically connected to the active component via conductive traces via a flip chip technology.

13. The optoelectronic assembly as claimed in claim 12, wherein said IC is mounted upon the first surface.

14. The optoelectronic assembly as claimed in claim 12, wherein a receiving cavity is formed in the second surface of said PCB to receive said lens module partially therein.

15. The optoelectronic assembly as claimed in claim 14, wherein said lenses are formed in a shallow region which is located in an upper surface of the lens module and in said receiving cavity of the PCB.

* * * * *